(12) United States Patent
Du et al.

(10) Patent No.: US 11,488,801 B1
(45) Date of Patent: Nov. 1, 2022

(54) THREE-DIMENSIONAL (3D) IMAGING SYSTEM AND METHOD FOR NANOSTRUCTURE

(71) Applicant: INSTITUTE OF GEOLOGY AND GEOPHYSICS, CHINESE ACADEMY OF SCIENCES, Beijing (CN)

(72) Inventors: Zhongming Du, Beijing (CN); Jijin Yang, Beijing (CN)

(73) Assignee: INSTITUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/727,739

(22) Filed: Apr. 23, 2022

(30) Foreign Application Priority Data

Dec. 29, 2021 (CN) .......................... 202111626000.9

(51) Int. Cl.
*H01J 37/20* (2006.01)
*H01J 37/06* (2006.01)
(Continued)

(52) U.S. Cl.
CPC ................ *H01J 37/20* (2013.01); *G01C 3/08* (2013.01); *H01J 37/06* (2013.01); *H01J 37/22* (2013.01);
(Continued)

(58) Field of Classification Search
CPC .. H01J 37/20; H01J 37/06; H01J 37/22; H01J 37/244; H01J 37/28; H01J 37/304;
(Continued)

(56) References Cited

U.S. PATENT DOCUMENTS 5,223,109 A * 6/1993 Itoh ..................... H01J 37/3056
204/298.36
6,039,000 A * 3/2000 Libby ................. H01J 37/3005
250/398
(Continued)

OTHER PUBLICATIONS

Ali Gholinia, et al., Coupled Broad Ion Beam-Scanning Electron Microscopy (BIB-SEM) for polishing and three dimensional (3D) Serial Section Tomography (SST), Ultramicroscopy, 2020, pp. 1-28.

*Primary Examiner* — David A Vanore
(74) *Attorney, Agent, or Firm* — Bayramoglu Law Offices LLC

(57) ABSTRACT

A 3D imaging system and method for a nanostructure is provided. The 3D imaging system includes a master control center, a vacuum chamber, an electron gun, an imaging signal detector, a broad ion beam source device, and a laser rangefinder component. A sample loading device is arranged inside the vacuum chamber. A radial source of the broad ion beam source device is arranged in parallel with an etched surface of a sample. The laser rangefinder component includes a first laser rangefinder configured to measure a distance from a top surface of an ion beam shielding plate and a second laser rangefinder configured to measure a distance from a non-etched area of the sample, the first laser rangefinder and the second laser rangefinder are arranged side by side, and a laser traveling direction is perpendicular to a traveling direction of the broad ion beam source device.

11 Claims, 5 Drawing Sheets

(51) Int. Cl.
*H01J 37/28* (2006.01)
*H01J 37/305* (2006.01)
*H01J 37/304* (2006.01)
*H01J 37/244* (2006.01)
*G01C 3/08* (2006.01)
*H01J 37/22* (2006.01)

(52) U.S. Cl.
CPC ............ *H01J 37/244* (2013.01); *H01J 37/28* (2013.01); *H01J 37/304* (2013.01); *H01J 37/3053* (2013.01); *H01J 2237/022* (2013.01); *H01J 2237/026* (2013.01); *H01J 2237/2007* (2013.01); *H01J 2237/20221* (2013.01); *H01J 2237/226* (2013.01); *H01J 2237/31745* (2013.01)

(58) Field of Classification Search
CPC ............. H01J 37/3053; H01J 2237/022; H01J 2237/026; H01J 2237/2007; H01J 2237/20221; H01J 2237/226; H01J 2237/31745; G01C 3/08
See application file for complete search history.

(56) References Cited

U.S. PATENT DOCUMENTS

| | | | | |
|---|---|---|---|---|
| 8,686,379 | B1 * | 4/2014 | Robinson | H01J 37/3056 |
| | | | | 250/307 |
| 8,894,796 | B2 * | 11/2014 | Hall | H01J 37/3056 |
| | | | | 977/924 |
| 8,912,490 | B2 * | 12/2014 | Kelley | G01N 1/32 |
| | | | | 250/311 |
| 9,733,164 | B2 * | 8/2017 | Wells | G01N 1/32 |
| 10,088,401 | B2 * | 10/2018 | Uemoto | H01J 37/31 |
| 10,465,293 | B2 * | 11/2019 | Miller | H01J 37/304 |
| 10,896,802 | B2 * | 1/2021 | Maazouz | H01J 37/21 |
| 11,328,897 | B2 * | 5/2022 | Shouji | H01J 37/228 |
| 11,393,657 | B2 * | 7/2022 | Shouji | H01J 37/228 |
| 2004/0108067 | A1 * | 6/2004 | Fischione | G01N 1/28 |
| | | | | 156/345.38 |
| 2013/0319849 | A1 * | 12/2013 | Fuller | G01N 1/32 |
| | | | | 204/298.36 |
| 2014/0319339 | A1 * | 10/2014 | Hall | H01J 37/3056 |
| | | | | 435/5 |
| 2019/0013178 | A1 * | 1/2019 | Zachreson | H01J 37/265 |
| 2021/0358731 | A1 * | 11/2021 | Wu | H01J 49/0463 |

* cited by examiner

THREE-DIMENSIONAL (3D) IMAGING SYSTEM AND METHOD FOR NANOSTRUCTURE

CROSS REFERENCE TO THE RELATED APPLICATIONS

This application is based upon and claims priority to Chinese Patent Application No. 202111626000.9, filed on Dec. 29, 2021, the entire contents of which are incorporated herein by reference.

TECHNICAL FIELD

The present disclosure belongs to the technical field of three-dimensional (3D) imaging, and in particular, to a 3D imaging system and method for a nanostructure.

BACKGROUND 3D imaging is an extremely important scientific research method, which is widely used in the fields of materials, semiconductor devices, and geology, and aims to obtain the internal 3D structure or composition of various materials. The focused ion beam-scanning electron microscope, computed tomography (CT), and nuclear magnetic resonance (NMR) are commonly used 3D imaging instruments. The resolution of NMR for material imaging is hundreds of micrometers. The 3D imaging methods of the CT and focused ion beam-scanning electron microscope are tomographic 3D reconstruction, using the original two-dimensional (2D) imaging method assisted by serial section technology to obtain sample interface image data, and then reconstructing a 3D structural model by binarizing the series of image data through image processing. The highest resolution of nano CT can reach 50-100 nanometers, and a diameter of a corresponding cylindrical sample that can be imaged is reduced to 50-100 micrometers. The focused ion beam-scanning electron microscope has the highest resolution, which can reach several nanometers, and the slice imaging area is tens of microns. The focused ion beam-scanning electron microscope is a dual-beam system. A focused ion beam is used to etch a sample layer by layer to obtain imaging sections, and an electron beam is used to acquire 2D data for each slice. The 2D image resolution of the field emission scanning electron microscope is as high as 1 nanometer, so the 3D imaging resolution is determined by the vertical resolution, that is, the thinnest etching thickness of the focused ion beam. In order to achieve extremely high etching precision, the ion beam is focused to tens to several nanometers. Although the etching accuracy and ion etching thickness have been improved, such a small beam needs to complete a large volume of cutting and electron microscope imaging, the time needs to be calculated in weeks, and the instrument cannot work for such a long time and remain stable. Therefore, it cannot complete large-volume etching across scales.

In order to solve the problem of slow etching by the focused ion beam, a three-beam system of a laser-focused ion beam-scanning electron microscope is provided. However, laser ablation causes great damage to the sample, and the ablation precision is in micron level, such that the rough surface electron microscope imaging cannot reflect the real situation of a nanostructure. This method is only suitable for rapidly exposing the region of interest (ROI) of the sample to the surface by laser ablation when the ROI is inside the sample, and then imaging a small part of the volume by the combination of the focused ion beam and the scanning electron microscope, which still cannot complete high-precision large-volume etching across scales.

Although existing 3D imaging instruments can achieve high spatial resolution, the problem of limited 3D reconstruction area is very prominent. For example, the micro-nano porous network structure and distribution of batteries or shale gas reservoirs are irregular in 3D space, and the 3D reconstruction of small areas is not representative. Therefore, it is difficult to form a unified and effective understanding of the research.

SUMMARY

In order to solve the problems of slow etching, low etching precision, and inability to complete large-volume etching across scales of imaging instruments in the prior art, the present disclosure provides a 3D imaging system and method for a nanostructure.

A first aspect of the present disclosure provides a 3D imaging system for a nanostructure, including: a master control center, a vacuum chamber, a sample loading device, an electron gun, an imaging signal detector, a broad ion beam source device, and a laser rangefinder component. The electron gun, the imaging signal detector, the broad ion beam source device, and the laser rangefinder component are all in signal connection with the master control center.

The vacuum chamber is configured to provide a high vacuum environment. The sample loading device is arranged inside the vacuum chamber. The sample loading device includes a multi-axis movement table and a sample loading table, and the sample loading table is detachably arranged on the multi-axis movement table to load a sample to be tested. The multi-axis movement table is arranged inside the vacuum chamber to adjust a spatial pose of the sample loading table. The electron gun is arranged above the vacuum chamber, and is configured to bombard a surface of the sample to excite a plurality of electronic signals. The imaging signal detector is configured to receive the excited electronic signals to obtain image information of the surface of the sample. The broad ion beam source device is configured to etch the sample. The sample loaded by the sample loading device is located in a traveling path of the broad ion beam source device, and a radial source of the broad ion beam source device is arranged in parallel with an etched surface of the sample. The laser rangefinder component includes a first laser rangefinder and a second laser rangefinder, the first laser rangefinder is configured to measure a distance from a top surface of an ion beam shielding plate in the sample loading table, the second laser rangefinder is configured to measure a distance from a non-etched area of the sample, the first laser rangefinder and the second laser rangefinder are arranged side by side, and a laser traveling direction is perpendicular to a broad ion beam traveling direction of the broad ion beam source device.

In some preferred embodiments, the multi-axis movement table includes a first bottom plate, a horizontal position adjusting mechanism, and a U-shaped table, and the U-shaped table includes a connecting portion connected to the horizontal position adjusting mechanism at a bottom. The first bottom plate is arranged at an inner bottom of the vacuum chamber, and the horizontal position adjusting mechanism is arranged above the first bottom plate. The horizontal position adjusting mechanism is configured to adjust a horizontal transversal position and a horizontal longitudinal position of the U-shaped table. The U-shaped table includes a U-shaped structure and a mandrel, both ends of the mandrel are separately rotatably connected to both side walls of the U-shaped structure, the mandrel is provided with a columnar structure on a side wall, the columnar structure and the mandrel are rotatably arranged, and a central axis of the columnar structure is arranged perpendicular to a central axis of the mandrel. The columnar structure is provided with a groove at an end.

The sample loading table includes a second bottom plate, a first direction adjusting device, a nano displacement mechanism, a sample holding mechanism, and an ion beam shielding mechanism, and a protrusion matched with the groove is formed at a bottom of the second bottom plate to fixedly connect the columnar structure. The first direction adjusting device is arranged at a top of the second bottom plate. The nano displacement mechanism is arranged above the first direction adjusting device, and the first direction adjusting device is configured to adjust a position of the nano displacement mechanism on a first plane. The sample holding mechanism is arranged on a side wall of the nano displacement mechanism, and the ion beam shielding mechanism is arranged on an outer side of the sample holding mechanism. The sample holding mechanism is configured to clamp the sample. The ion beam shielding mechanism is configured to adjust a to-be-etched area of the sample.

In some preferred embodiments, the sample holding mechanism may include a first clamping plate and a second clamping plate arranged in parallel, the first clamping plate may be arranged away from a side wall of the nano displacement mechanism, and the second clamping plate may be arranged at a side away from the broad ion beam source device.

The first clamping plate may be lower in height than the second clamping plate.

The first clamping plate may be set as a wedge-shaped structure matched with the ion beam shielding mechanism at a top.

A side of the second clamping plate away from the first clamping plate may be connected to the nano displacement mechanism through a coarse sample height adjusting structure. The coarse sample height adjusting structure may be configured to adjust a height of the sample.

In some preferred embodiments, the ion beam shielding mechanism may include the ion beam shielding plate and a shielding plate bracket, and the shielding plate bracket may be connected to the ion beam shielding plate at one end, and connected to the second bottom plate at the other end. A side of the ion beam shielding plate away from the shielding plate bracket may be arranged in parallel with the wedge-shaped structure.

In some preferred embodiments, the imaging system may further include a pollution isolation cover. The pollution isolation cover may be sleeved on an outer side of an end of the electron gun. The pollution isolation cover may be arranged in an inverted trapezoid, and the pollution isolation cover may not interfere with the broad ion beam source device and the laser rangefinder component. A through hole and an auto-open/close shielding plate configured to shield the through hole may be arranged at a bottom of the pollution isolation cover, and the auto-open/close shielding plate may be in signal connection with the master control center.

A plane of the sample loaded by the sample loading table may be in a coverage area of the electron gun. The plane of the sample may have an included angle θ with a radial action direction of the electron gun, where $\theta \in [90°, 150°]$.

An axial center of the broad ion beam source device, an axial center of the first laser rangefinder, and an axial center of the electron gun may be located in a same plane. The laser rangefinder component and the broad ion beam source device may be separated on both sides of the electron gun at a first preset included angle.

In some preferred embodiments, the auto-open/close shielding plate may be in signal connection with the master control center to enable acquisition of an image of an etched sample under control of the master control center.

In a working process, the master control center may control the vacuum chamber to provide a required environment based on a type of the sample, and control the multi-axis movement table to drive the sample loading table to move to a preset spatial position based on the broad ion beam source device and the spatial pose of the laser rangefinder component, the broad ion beam source device may etch the sample, the first laser rangefinder and the second laser rangefinder may obtain corresponding height information in real time, and then the imaging signal detector may obtain image information of a slice with a preset thickness of the surface of the sample. The master control center may obtain a 3D model of the sample based on image information of a plurality of corresponding slices obtained by a plurality of etchings.

In some preferred embodiments, the imaging system may further include a pollution isolation cover. The pollution isolation cover and the laser rangefinder component may be both arranged on a first side wall of the vacuum chamber, and the laser rangefinder component may be arranged inside a chamber formed by the pollution isolation cover and the first side wall.

The broad ion beam source device may be arranged on a second side wall of the vacuum chamber, and a via for the broad ion beam source device to etch the sample may be formed at one side of the pollution isolation cover. The second side wall may be arranged adjacent to the first side wall.

A plane of the sample loaded by the sample loading table may be in a coverage area of the electron gun. The plane of the sample may be arranged perpendicular to the radial action direction of the electron gun. A radial action direction of the laser rangefinder component may be arranged in parallel with the radial action direction of the electron gun. A radial action direction of the broad ion beam source device may be horizontally arranged.

In some preferred embodiments, in a process of etching the sample, the sample loading table may move to the inside of the pollution isolation cover, the broad ion beam source device may etch the sample, and the first laser rangefinder and the second laser rangefinder may obtain corresponding height information in real time.

After the etching is completed, the master control center may control the multi-axis movement table to drive the sample loading table to move to a preset spatial position based on the spatial pose of the electron gun, and the imaging signal detector may obtain image information of a slice of the surface of the sample. The master control center may obtain a 3D model of the sample based on image information of a plurality of corresponding slices obtained by a plurality of etchings.

In some preferred embodiments, the imaging signal detector may be a secondary electron probe, a backscatter probe, an electron backscatter diffraction probe, or a spectrum probe.

A second aspect of the present disclosure provides a super-resolution cross-scale 3D imaging method, based on the 3D imaging system for a nanostructure described in any of the above, and including the following steps: step S100, fixing the sample by the sample loading table to make a target area in the sample protrude;

step S200, controlling, by the master control center, the multi-axis movement table to adjust the sample loading table to drive the sample to move to the preset spatial position matched with a position of the broad ion beam source device to meet preset etching requirements of the broad ion beam source device;

step S300, starting the broad ion beam source device for initial cutting, etching all areas by the preset thickness in the protruding target area, and then closing the broad ion beam source device; obtaining a first 2D slice through the imaging signal detector, covering an imaging calibration label during acquisition of the image, measuring a first distance from the top surface of the ion beam shielding plate in the sample loading table with the first laser rangefinder, and measuring a second distance from the non-etched area of the sample with the second laser rangefinder; and adjusting, by the master control center, the multi-axis movement table and the sample loading table to a preset position based on the first distance, the second distance, and the preset spatial position;

step S400, performing etching for N times, determining whether a total etching thickness is the same as the preset thickness of the 2D slice, and if not, repeating step S300; and if yes, executing step S500; and step S500, obtaining the 3D model of the sample based on obtained N 2D slices.

The beneficial effects of the present disclosure are: 1) the solution provided by the present disclosure can expand the super-resolution 3D imaging area of samples of materials, semiconductor devices, and geology to the square millimeter level, increase the 3D imaging volume with the same high resolution by at least six orders of magnitude, and can meet the research needs of micro-nano porous network structures and distributions with irregularity in 3D space such as batteries and shale gas reservoirs; 2) The device provided by the present disclosure greatly reduces the cost of a 3D imaging device.

BRIEF DESCRIPTION OF THE DRAWINGS

Other features, objectives and advantages of the present disclosure will become more apparent upon reading the detailed description of the non-restrictive embodiments with reference to the following drawings.

Figure 1:
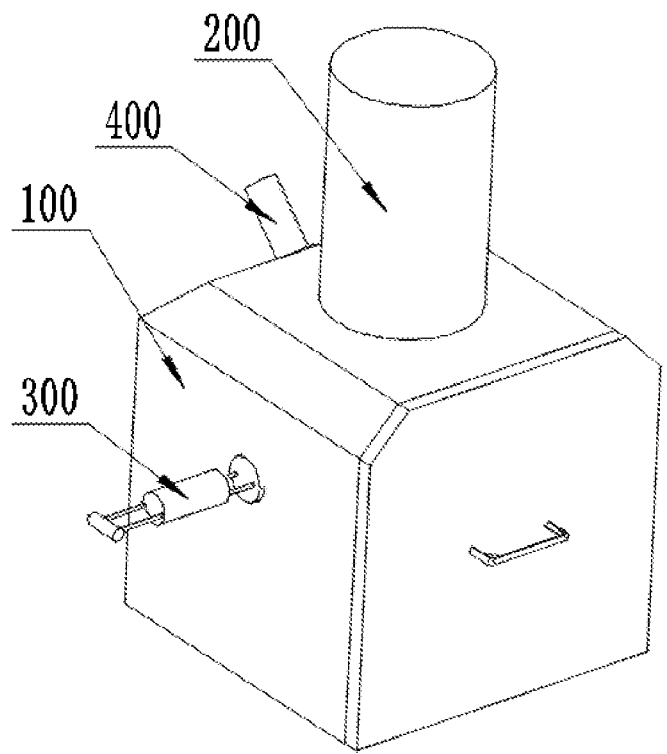
FIG. 1 is a schematic diagram of a first embodiment of a 3D imaging system for a nanostructure in the present disclosure from a first angle.

Reference numerals: 100, a vacuum chamber; 200, an electron gun; 300, an imaging signal detector; 400, a broad ion beam source device; 500, a laser rangefinder component, 510, a first laser rangefinder, and 520, a second laser rangefinder; 600, a sample loading device; 610, a multi-axis movement table; 611, a first bottom plate; 612, a horizontal position adjusting mechanism; 613, a U-shaped table, 6131, a U-shaped structure, 6132, a mandrel, 6133, a columnar structure, and 6134, a connecting portion; 620, a sample loading table; 621, a second bottom plate, 622, a first direction adjusting device, 623, a nano displacement mechanism, 6231, a dust cover plate, and 6232, a piezoelectric ceramic piece; 6233, an angle adjusting mechanism; 624, a sample holding mechanism, 6241, a first clamping plate, and 6242, a second clamping plate; 625, an ion beam shielding mechanism, 6251, an ion beam shielding plate, 6252, a shielding plate bracket, 6261, a first label, and 6262, a second label; 627, a sample; and 700, a pollution isolation cover, and 710, an auto-open/close shielding plate.

DETAILED DESCRIPTION OF THE EMBODIMENTS

The preferred implementations of the present disclosure are described below with reference to the drawings. Those skilled in the art should understand that the implementations herein are merely intended to explain the technical principles of the present disclosure, rather than to limit the protection scope of the present disclosure.

The present disclosure is further described below with reference to the drawings and embodiments.

Figure 2:
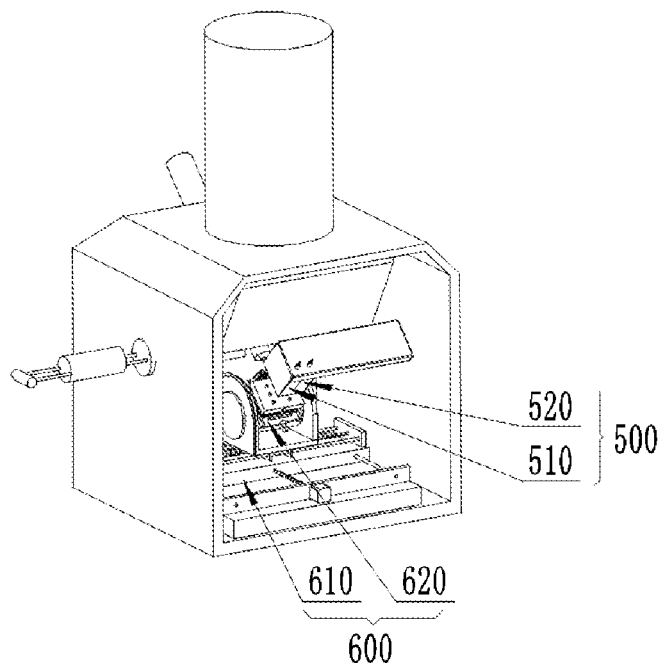
FIG. 2 is a specific schematic diagram of the first embodiment of the 3D imaging system for a nanostructure in the present disclosure.

With reference to FIG. 1 and FIG. 2, a first aspect of the present disclosure provides a 3D imaging system for a nanostructure, including: a master control center, a vacuum chamber 100, a sample loading device, an electron gun 200, an imaging signal detector 300, a broad ion beam source device 400, and a laser rangefinder component 500. The electron gun, the imaging signal detector, the broad ion beam source device, and the laser rangefinder component are all in signal connection with the master control center. The vacuum chamber is configured to provide a high vacuum environment required for the electron gun, the imaging signal detector, and the broad ion beam source device. The sample loading device 600 is arranged inside the vacuum chamber. The sample loading device includes a multi-axis movement table 610 and a sample loading table 620, and the sample loading table is detachably arranged on the multi-axis movement table to load a sample to be tested. The multi-axis movement table is arranged inside the vacuum chamber to adjust a spatial pose of the sample loading table. The electron gun is arranged above the vacuum chamber with a vacuum flange, and is configured to bombard a surface of the sample to excite a plurality of electronic signals. The imaging signal detector is connected to the vacuum chamber with a vacuum flange, and is configured to receive the electronic signals excited by electron gun bombardment of the sample to obtain image information of the surface of the sample. The broad ion beam source device is configured to etch the sample. The sample loaded by the sample loading device is located in a traveling path of the broad ion beam source device, and a radial source of the broad ion beam source device is arranged in parallel with an etched surface of the sample. The laser rangefinder component is fixedly connected inside the vacuum chamber, and includes a first laser rangefinder 510 and a second laser rangefinder 520, the first laser rangefinder is configured to measure a distance from a top surface of an ion beam shielding plate in the sample loading table, the second laser rangefinder is configured to measure a distance from a non-etched area of the sample, the first laser rangefinder and the second laser rangefinder are arranged side by side, and a laser traveling direction is perpendicular to a traveling direction of the broad ion beam source device.

At present, the super-resolution 3D imaging device (focused ion beam-scanning electron microscope) can achieve nanometer resolution, but the imaging area is extremely small, which is difficult to meet the imaging needs of heterogeneous samples. At the same time, the cost of 3D imaging devices of the focused ion beam-scanning electron microscope dual-beam system and the laser-focused ion beam-scanning electron microscope three-beam system is extremely high. The system provided by the present disclosure can achieve super-resolution 3D imaging of samples of materials, semiconductor devices, and geology, can expand the imaging area to the square millimeter level, and increase the 3D imaging volume with the same high resolution by at least six orders of magnitude, and greatly reduces the cost of a 3D imaging device.

Figure 3:
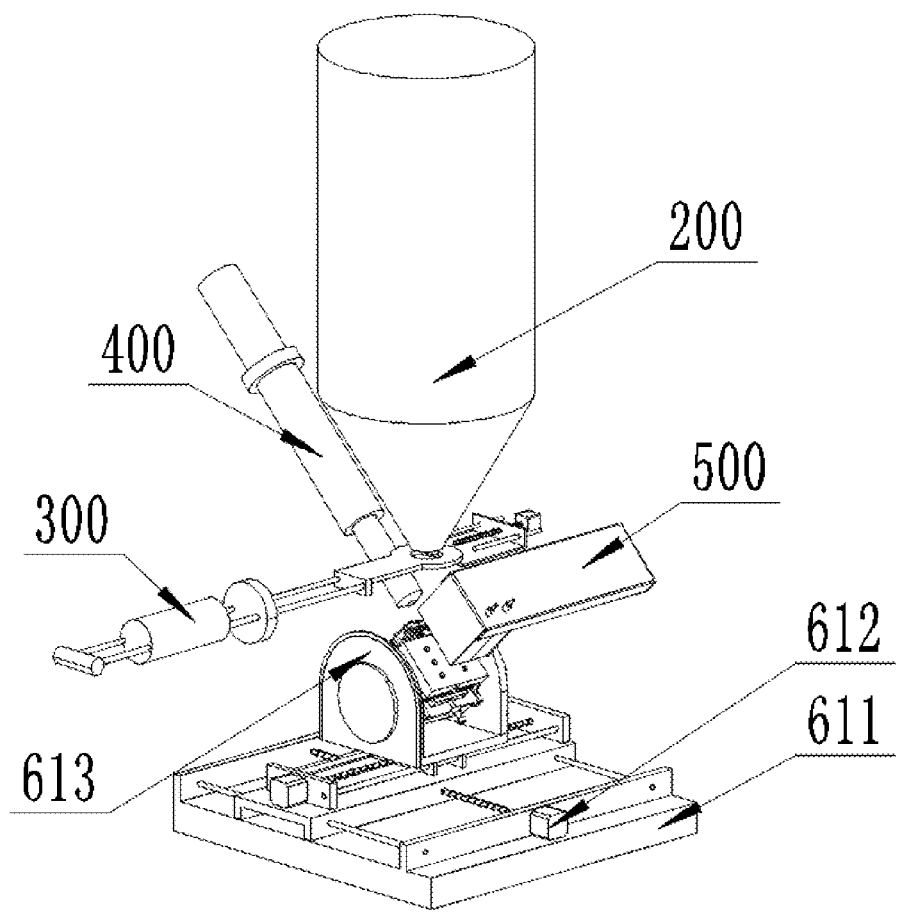
FIG. 3 is an internal schematic diagram of the first embodiment of the 3D imaging system for a nanostructure in the present disclosure.
Figure 4:
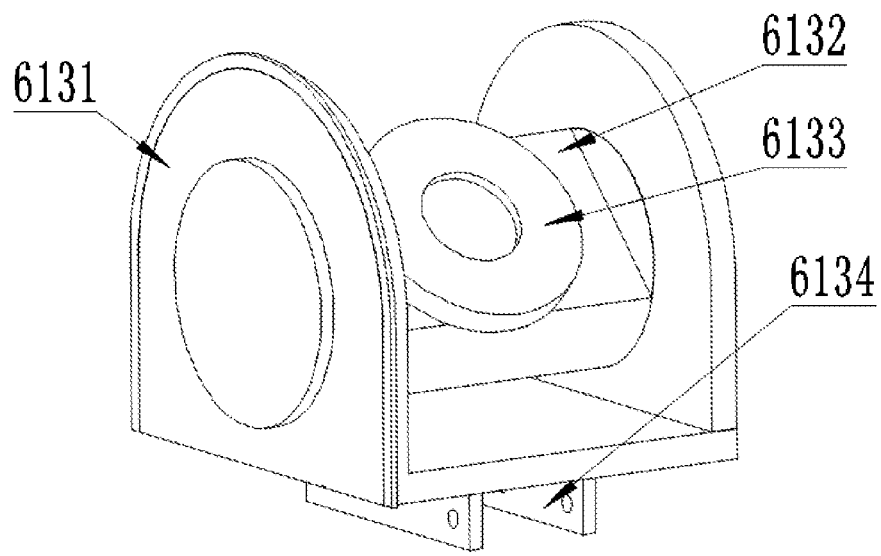
FIG. 4 is a schematic diagram of a U-shaped table in FIG. 3.

With reference to FIG. 3 and FIG. 4, the multi-axis movement table includes a first bottom plate 611, a horizontal position adjusting mechanism 612, and a U-shaped table 613, and the U-shaped table includes a connecting portion 6134 connected to the horizontal position adjusting mechanism at a bottom. The first bottom plate is arranged at an inner bottom of the vacuum chamber, and the horizontal position adjusting mechanism is arranged above the first bottom plate. The horizontal position adjusting mechanism is configured to adjust a horizontal transversal position and a horizontal longitudinal position of the U-shaped table. Further, the U-shaped table includes a U-shaped structure 6131 and a mandrel 6132, both ends of the mandrel are separately rotatably connected to both side walls of the U-shaped structure, the mandrel is provided with a columnar structure 6133 on a side wall, the columnar structure and the mandrel are rotatably arranged, and a central axis of the columnar structure is arranged perpendicular to a central axis of the mandrel. The columnar structure is provided with a groove at an end connected to the sample loading table.

Figure 5:
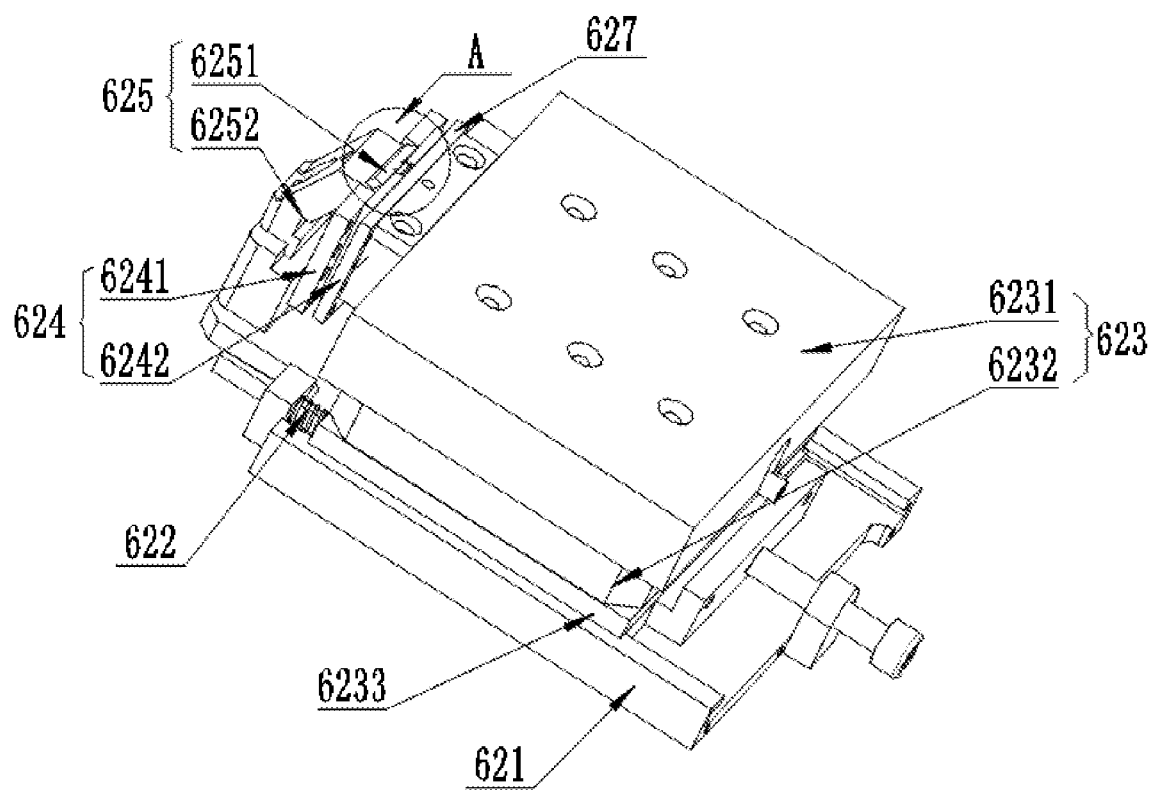
FIG. 5 is a schematic diagram of a sample loading table in FIG. 3.
Figure 6:
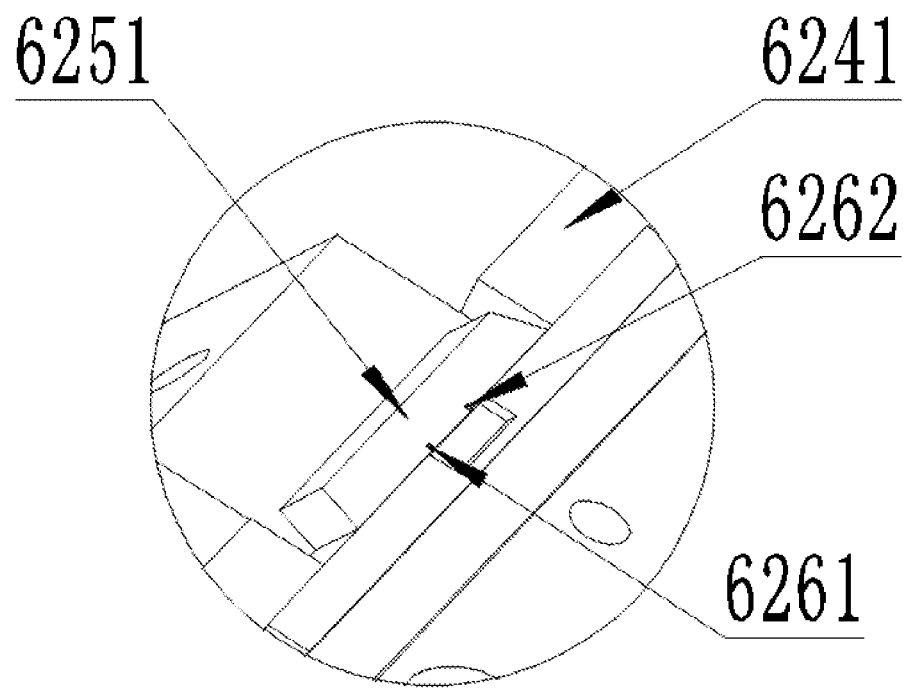
FIG. 6 is a partial enlarged view of A in FIG. 5.

Further, with reference to FIG. 5 and FIG. 6, the sample loading table includes a second bottom plate 621, a first direction adjusting device 622, a nano displacement mechanism 623, a sample holding mechanism 624, an ion beam shielding mechanism 625, and a protrusion matched with the groove is formed at a bottom of the second bottom plate to fixedly connect the columnar structure. The first direction adjusting device is arranged at a top of the second bottom plate. The nano displacement mechanism is arranged above the first direction adjusting device, and the first direction adjusting device is configured to adjust a position of the nano displacement mechanism on a first plane. The sample holding mechanism is arranged on a side wall of the nano displacement mechanism, and the ion beam shielding mechanism is arranged on an outer side of the sample holding mechanism. The sample holding mechanism is configured to clamp the sample. The ion beam shielding mechanism is configured to adjust a to-be-etched area of the sample. In the present embodiment, the sample holding mechanism is driven to drive the sample to move by adjusting the height of the nano displacement mechanism, such that the height of the part of the sample exposed out of the ion beam shielding mechanism can be adjusted.

Further, the first direction adjusting device includes a position adjusting plate, a position adjusting return spring component, and a position adjusting knob. The position adjusting plate is arranged below the nano displacement mechanism. The position adjusting return spring component is arranged at one end of the position adjusting plate, and the position adjusting knob is arranged at the other end of the position adjusting plate. The position adjusting plate moves under the adjustment of the position adjusting return spring component and the position adjusting knob to adjust a distance between the sample and the ion beam shielding mechanism. An angle adjusting mechanism 6233 is arranged between the nano displacement mechanism and the position adjusting plate. The angle adjusting mechanism is movably connected to the first direction adjusting device to carry the nano displacement mechanism and adjust a spatial angle of the sample carried by the nano displacement mechanism. A circular hole is formed at a center of the angle adjusting mechanism, the position adjusting plate is provided with a protruding shaft at a top, and the protruding shaft and the circular hole can be rotatably matched. The angle adjusting mechanism and the first direction adjusting device can be locked together by a locking mechanism such as a screw after angle adjustment.

The nano displacement mechanism includes a dust cover plate 6231 and a piezoelectric ceramic piece 6232. The piezoelectric ceramic piece is configured to generate nano precision deformation by controlling the applied electric fields of different strengths. The dust cover plate is fixedly connected to a top of the piezoelectric ceramic piece. The angle adjusting mechanism is fixedly arranged at a bottom of the piezoelectric ceramic piece.

Specifically, the sample holding mechanism includes a first clamping plate 6241 and a second clamping plate 6242 arranged in parallel, the first clamping plate is arranged away from a side wall of the nano displacement mechanism, and the second clamping plate is arranged at a side away from the broad ion beam source device. The first clamping plate is lower in height than the second clamping plate. The first clamping plate is set as a wedge-shaped structure matched with the ion beam shielding mechanism at a top. The sample 627 is arranged between the first clamping plate and the second clamping plate.

A side of the second clamping plate away from the first clamping plate is connected to the nano displacement mechanism through a coarse sample height adjusting structure. The coarse sample height adjusting structure is configured to adjust a height of the sample.

The ion beam shielding mechanism includes the ion beam shielding plate 6251 and a shielding plate bracket 6252, and the shielding plate bracket is connected to the ion beam shielding plate at one end, and connected to the second bottom plate at the other end. A side of the ion beam shielding plate away from the shielding plate bracket is arranged in parallel with the wedge-shaped structure, and the top side of the ion beam shielding plate is configured to contact the sample.

Further, an imaging calibration label is fixed on the ion beam shielding plate for calibration during image acquisition. The imaging calibration label includes a first label 6261 and a second label 6262. The ion beam shielding plate is provided with a first groove for accommodating the first label and a second groove for accommodating the second label (on a side close to the sample). The first label, the second label and the ion beam shielding plate share the same top surface. The ion beam shielding plate and the imaging calibration label are made of two types of high hardness materials with different compositions, such as tungsten steel and titanium.

Further, the shielding plate bracket includes a first section of shielding plate bracket and a second section of shielding plate bracket. The first section of shielding plate bracket is fixedly connected to the second bottom plate at one end, and is configured to carry the second section of shielding plate bracket at a top end. The first section of shielding plate bracket is arranged perpendicular to a top surface of the second bottom plate. An upward longitudinal axis of the second section of shielding plate bracket is inclined with an upward longitudinal axis of the first section of shielding plate bracket. The ion beam shielding plate is arranged at a top of the second section of shielding plate bracket. The first clamping plate is provided with a wedge-shaped groove at a top, and an angle of the wedge-shaped groove is the same as an inclination angle of the ion beam shielding plate.

Laser emitted by the laser rangefinder intersects with the top surface of the ion beam shielding plate, and an included angle ranges from 45° to 135°, preferably 90°.

Further, the electron gun has a taper angle of a, and an included angle between a laser emission radial direction of the laser rangefinder component and a longitudinal axis of the electron gun is $\alpha/2$. An included angle between a longitudinal axis of the broad ion beam source device and the longitudinal axis of the electron gun is $90°-\alpha/2$.

Further, the coarse sample height adjusting structure is an adjusting slide rail, and a protrusion corresponding to the slide rail is formed in the second clamping plate for coarse adjustment of the height of the sample.

Figure 7:
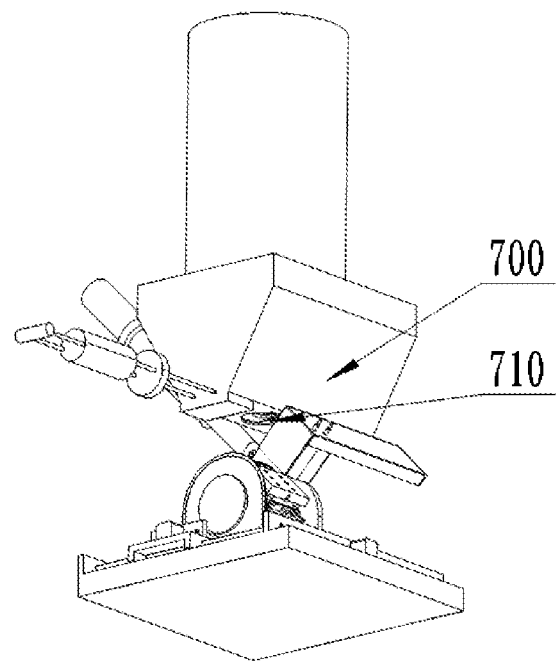
FIG. 7 is a schematic diagram of internal parts of the first embodiment of the 3D imaging system for a nanostructure in the present disclosure from another angle.

Further, with reference to FIG. 7, in the present embodiment, the imaging system further includes a pollution isolation cover. The pollution isolation cover is arranged at a top of the vacuum chamber, and is sleeved on an outer side of an end of the electron gun. The pollution isolation cover is arranged in an inverted trapezoid, and the pollution isolation cover does not interfere with the broad ion beam source device and the laser rangefinder component. A through hole and an auto-open/close shielding plate 710 configured to shield the through hole are arranged at a bottom of the pollution isolation cover, and the auto-open/close shielding plate is in signal connection with the master control center to enable acquisition of an image of an etched sample under control of the master control center. In the present embodiment, a plane where the surface of the sample is located is inclined with a radial axis of the electron gun, and a plane of the sample loaded by the sample loading table is in a coverage area of the electron gun. In a working process, the master control center controls the vacuum chamber to provide a required environment based on a type of the sample, and controls the multi-axis movement table to drive the sample loading table to move to a preset spatial position based on the broad ion beam source device and the spatial pose of the laser rangefinder component, the broad ion beam source device etches the sample, the first laser rangefinder and the second laser rangefinder obtains corresponding height information in real time, and then the imaging signal detector obtains image information of a slice with a preset thickness of the surface of the sample. The master control center obtains a 3D model of the sample based on image information of a plurality of corresponding slices obtained by a plurality of etchings.

Preferably, the plane of the sample has an included angle $\theta$ with a radial action direction of the electron gun, and $\theta \in [90°, 150°]$.

An axial center of the broad ion beam source device, an axial center of the first laser rangefinder, and an axial center of the electron gun are located in a same plane.

Further, the axis line of the broad ion beam source device, the axis line of the first laser rangefinder, and the axis line of the electron gun intersect at a point, which is located on a symmetry line of the top plane of the sample loading table, and the symmetry line passes through the top surface of the ion beam shielding plate.

In the present embodiment, the laser rangefinder component and the broad ion beam source device are separated on both sides of the electron gun at a first preset included angle.

Preferably, the laser rangefinder component and the broad ion beam source device are arranged perpendicular to each other, and both have an included angle of 45° with the electron gun. It should be noted that generally, the included angle between the laser rangefinder component and the electron gun may not exceed 60°.

A first embodiment specifically relates to a 3D imaging method for shale nanopores, including the following steps. Step S100, the sample is fixed by the sample loading table to make a target area in the sample protrude from the ion beam shielding plate. The nanostructure of the surface of the sample before ion etching is unreal and cannot be directly imaged. Step S200, the master control center controls the multi-axis movement table to adjust the sample loading table to drive the sample to move to the preset spatial position matched with a position of the broad ion beam source device to meet preset etching requirements of the broad ion beam source device. In the present embodiment, moving the sample to the preset spatial position is to move the sample to the intersection of the ion beam, electron beam and laser beam, and the ion beam shielding plate faces the broad ion source. Step S300, the broad ion beam source device is started for initial cutting, all areas in the protruding target area are etched by the preset thickness, and then the broad ion beam source device is closed. A first distance from the top surface of the broad ion beam shielding plate is measured with the first laser rangefinder, and a second distance from the non-etched area of the sample is measured with the second laser rangefinder to eliminate errors caused by thermal expansion and repeated positioning of the slide table. The auto-open/close shielding plate is opened, a first 2D slice is acquired through the imaging signal detector, and the imaging calibration label is covered during acquisition of the image. The master control center adjusts the sample loading table to a preset position based on the first distance, the second distance, and the preset spatial position. Step S400, etching is performed for N times. Based on an obtained total thickness of the etching for N times, whether the total etching thickness is the same as the preset thickness of the 2D slice is determined, if not, step S300 is repeated, and if yes, step S500 is executed. Step S500, the 3D model of the sample is obtained based on the obtained N 2D slices. Specifically, 3D reconstruction is performed with the help of image processing software. Since the component difference map of the ion beam shielding plate and the image calibration label will form a brightness difference boundary, and the image will not change with the slice, the boundary can be used to align the image of the 2D slice during reconstruction to improve the quality of 3D imaging.

Further, after the acquisition of the first 2D slice is completed, the auto-open/close shielding plate is closed for second broad ion beam etching. Real time monitoring is performed by the first laser rangefinder and the second laser rangefinder during etching. The distance from the top surface of the ion beam shielding plate in the sample loading table measured with the first laser rangefinder is $D_{11}$. The distance from the non-etched area of the sample measured with the second laser rangefinder is $D_{21}$. $H=H_0+(n-1)D+[(D_{21}-D_{20})-(D_{11}-D_{10})]\sin\theta$. H is a real height of the nano displacement mechanism. $H_0$ is an initial height of the nano displacement mechanism. n is the current number of slices. $D_{10}$ is the distance from the top surface of the ion beam shielding plate in the sample loading table measured with the first laser rangefinder during first broad ion beam etching. $D_{20}$ is the distance from the non-etched area of the sample measured with the second laser rangefinder during first broad ion beam etching. D is the preset thickness of the 2D slice (that is, a preset vertical resolution of the 3D slice). $\theta$ is an included angle between the laser and the surface of the sample measured with the laser rangefinder to ensure that the etching thickness of the sample this time is D. After the etching is completed, the broad ion beam is disabled, the auto-open/close shielding plate is opened, and a second 2D slice is acquired, which is repeated until all the 2D slices are acquired. After acquisition of all the 2D slices is completed, 3D reconstruction is performed with the help of image processing software. Since the component difference map of the ion beam shielding plate and the image calibration label will form a brightness difference boundary, and the image will not change with the slice, the boundary can be used to align the image of the 2D slice during reconstruction to improve the quality of 3D imaging.

In the present disclosure, through the arrangement of the ion beam shielding plate, the area with the preset thickness in the protruding target area can be set according to the preset requirements to ensure the thickness of the slices when etching is performed each time. The height of the nano displacement mechanism is adjusted for N times to complete etching for N times for the total etching thickness, which is repeated to obtain continuous 3D slices.

Figure 8:
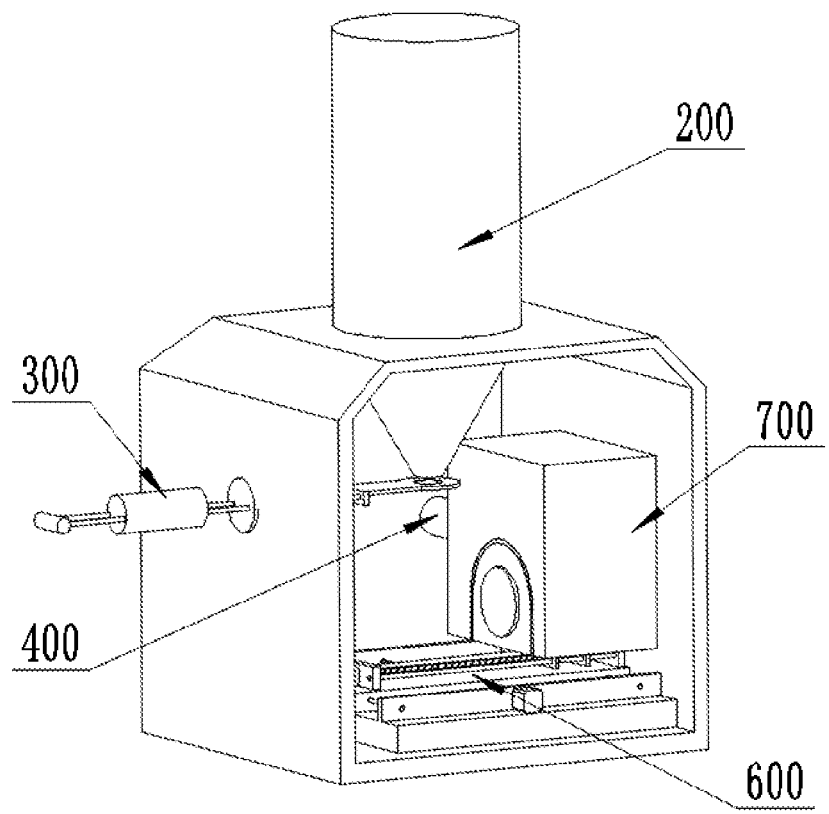
FIG. 8 is a schematic diagram of a second embodiment of the 3D imaging system for a nanostructure in the present disclosure from a first angle.
Figure 9:
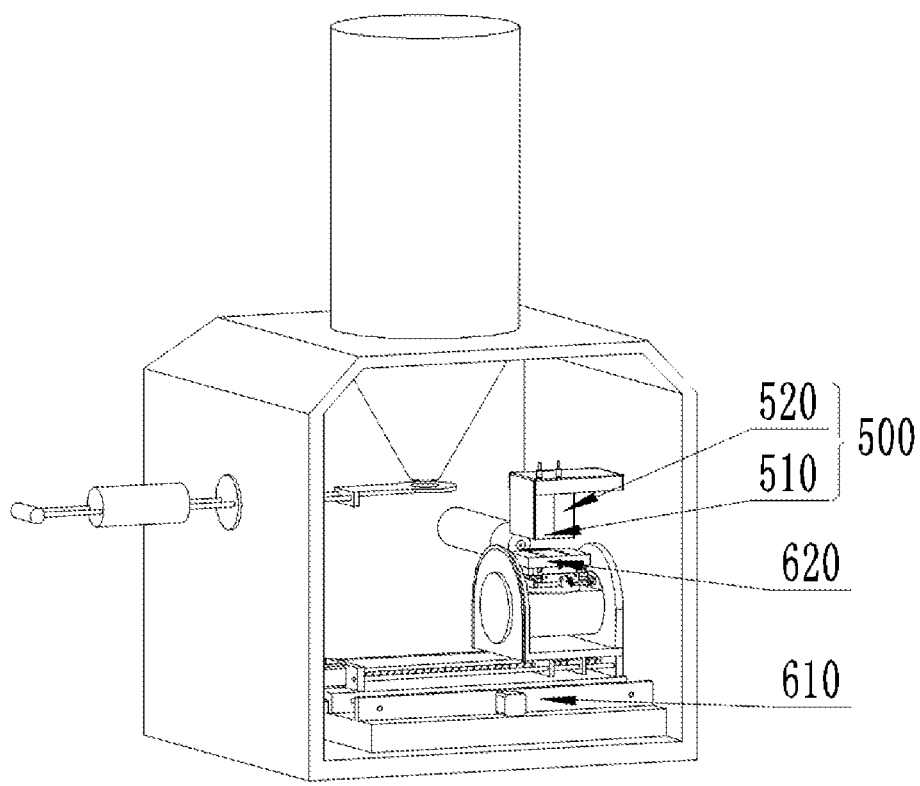
FIG. 9 is a schematic diagram of the second embodiment of the 3D imaging system for a nanostructure in the present disclosure from a second angle.

With reference to FIG. 8 and FIG. 9, in a second embodiment of the solution, the imaging system further includes a pollution isolation cover. The pollution isolation cover 700 and the laser rangefinder component 500 are both arranged on a first side wall of the vacuum chamber, and the laser rangefinder component is arranged inside a chamber formed by the pollution isolation cover and the first side wall. The broad ion beam source device 400 is arranged on a second side wall of the vacuum chamber, and a via for the broad ion beam source device to etch the sample is formed at one side of the pollution isolation cover. The second side wall is arranged adjacent to the first side wall. In the etching state, the radial action direction of the laser rangefinder component is arranged in parallel with the radial action direction of the electron gun. The radial action direction of the broad ion beam source device is horizontally arranged to etch the sample. In the present embodiment, the sample loading table is horizontally arranged, the laser rangefinder component is vertically arranged, the broad ion beam source device is horizontally arranged and the central axis of its beam source is parallel to the top surface of the nano displacement mechanism in the sample loading table.

In the present embodiment, the broad ion beam source device and the laser rangefinder component are assembled close to one side of the vacuum chamber wall rather than directly below the electron gun, and the space is wide, which is convenient for installation. Pollutants are controlled in a small pollution isolation cover at the same time, which is easier for implementation when a plurality of imaging signal detectors are installed in the vacuum chamber.

When testing is required after etching, the sample loading table is moved below the electron gun driven by the multi-axis movement table. At this time, the plane of the sample loaded by the sample loading table is in the coverage area of the electron gun. The plane of the sample is arranged perpendicular to the radial action direction of the electron gun, and information of the slice after each etching is obtained through the electron gun and the imaging signal detector and transmitted to the master control center.

In a process of etching the sample, the sample loading table moves to the inside of the pollution isolation cover, the broad ion beam source device etches the sample, and the first laser rangefinder and the second laser rangefinder obtain corresponding height information in real time. After the etching is completed, the master control center controls the multi-axis movement table to drive the sample loading table to move to a preset spatial position based on the spatial pose of the electron gun, and the imaging signal detector obtains image information of a slice of the surface of the sample. The master control center obtains a 3D model of the sample based on image information of a plurality of corresponding slices obtained by a plurality of etchings.

Preferably, the imaging signal detector is a secondary electron probe, a backscatter probe, an electron backscatter diffraction probe, or a spectrum probe.

The second embodiment relates to a 3D imaging method for shale nanopores, including the following steps. Step S100, the sample is fixed by the sample loading table to make a target area in the sample protrude from the ion beam shielding plate. Step S200, the master control center controls the multi-axis movement table to adjust the sample loading table to drive the sample to move to the preset spatial position matched with a position of the broad ion beam source device to meet preset etching requirements of the broad ion beam source device. In the present embodiment, moving the sample to the preset spatial position is to move the sample to the intersection of the ion beam and laser beam, and the ion beam shielding plate faces the broad ion source.

Step S300, the broad ion beam source device is started for initial cutting, all areas in the protruding target area are etched by the preset thickness, and then the broad ion beam source device is closed. A first distance from the top surface of the ion beam shielding plate in the sample loading table is measured with the first laser rangefinder to control the etching thickness, and a second distance from the non-etched area of the sample is measured with the second laser rangefinder to eliminate errors caused by thermal expansion and repeated positioning of the slide table. By adjusting the multi-axis movement table, the sample loading table is moved to the area covered by the electron gun, a first 2D slice is acquired through the imaging signal detector, and the imaging calibration label is covered during acquisition of the image. After first imaging is completed, the master control center controls the multi-axis movement table to adjust the sample loading table to drive the sample to the preset spatial position matched with a position of the broad ion beam source device to meet preset etching requirements of the broad ion beam source device. At the same time, the first laser rangefinder measures the distance from the top of the ion beam shielding plate, cooperates with the second laser rangefinder to measure the second distance from the non-etched area of the sample, calculates the height relationship between the sample and the ion beam shielding plate, and ensures that the top surface of the ion beam shielding plate is flush with the bottom surface of this slice through the real-time adjustment of the nano displacement mechanism, that is, to ensure that this sample is etched with only a vertically resolved thickness. Step S400, etching is performed for N times. Based on an obtained total thickness of the etching for N times, whether the total etching thickness is the same as the preset thickness of the 2D slice is determined, if not, step S300 is repeated, and if yes, step S500 is executed. Step S500, the 3D model of the sample is obtained based on the obtained N 2D slices.

Further, after acquisition of the first 2D slice is completed, the multi-axis movement table drives the sample loading table to the initial position, that is, the inside of the pollution isolation cover, and second broad ion beam etching is performed. Real time monitoring is performed by the first laser rangefinder and the second laser rangefinder during etching. The distance from the top surface of the ion beam shielding plate in the sample loading table measured with the first laser rangefinder is $D_{11}$. The distance from the non-etched area of the sample measured with the second laser rangefinder is $D_{21}$. $H=H_0+(n-1)D+[(D_{21}-D_{20})-(D_{11}-D_{10})]\sin\theta$. H is a real height of the nano displacement mechanism. $H_0$ is an initial height of the nano displacement mechanism. n is the current number of slices. $D_{10}$ is the distance from the top of the ion beam shielding plate measured with the first laser rangefinder during first broad ion beam etching. $D_{20}$ is the distance from the non-etched area of the sample measured with the second laser rangefinder during first broad ion beam etching. D is the preset thickness of the 2D slice (that is, a preset vertical resolution of the 3D slice). $\theta$ is an included angle between the laser and the surface of the sample measured with the laser rangefinder to ensure that the etching thickness this time is D. After the etching is completed, the broad ion beam is disabled, by adjusting the multi-axis movement table, the sample loading table is moved to the area covered by the electron gun, and a second 2D slice is acquired, which is repeated until all the 2D slices are acquired. After acquisition of all the 2D slices is completed, 3D reconstruction is performed with the help of image processing software. Since the component difference map of the ion beam shielding plate and the image calibration label will form a brightness difference boundary, and the image will not change with the slice, the boundary can be used to align the image of the 2D slice during reconstruction to improve the quality of 3D imaging.

The solution provided by the present disclosure can expand the super-resolution 3D imaging area of samples of materials, semiconductor devices, and geology to the square millimeter level, and increase the 3D imaging volume with the same high resolution by at least six orders of magnitude. The research needs of micro-nano porous network structures and distributions with irregularity in 3D space such as batteries and shale gas reservoirs can be met. The solution provided by the present disclosure greatly reduces the cost of the 3D imaging device.

Further, in a third embodiment of the present disclosure, on the basis of the second embodiment, the laser rangefinder component further includes a third laser rangefinder. Real time monitoring is performed by the first laser rangefinder and the second laser rangefinder during etching. The first laser rangefinder measures the distance from the top surface of the ion beam shielding plate $D_{11}$. The second laser rangefinder measures the distance from the non-etched area of the sample $D_{21}$. $H=H_0+(n-1)D+[(D_{21}-D_{20})-(D_{11}-D_{10})]\sin\theta$. H is a real height of the nano displacement mechanism. $H_0$ is an initial height of the nano displacement mechanism. n is the current number of slices. $D_{10}$ is the distance from the top surface of the ion beam shielding plate measured with the first laser rangefinder during first broad ion beam etching. $D_{20}$ is the distance from the non-etched area of the sample measured with the second laser rangefinder during first broad ion beam etching. D is the preset thickness of the 2D slice (that is, a preset vertical resolution of the 3D slice). $\theta$ is an included angle between the laser and the surface of the sample measured with the laser rangefinder to ensure that the etching thickness this time is D. The third laser range finder is configured to measure the distance from the etched area of the sample, and is set as $D_{31}$. $D_{30}$ is the distance from the etched area of the sample measured with the third laser rangefinder during first broad ion beam etching, through combination with $D_{21}$, an overall etching thickness $D_{01}$ can be obtained, and a calculation formula is: $D_{01}=D_{31}-D_{21}+D_{20}$. If $D_{01}=D_{31}-D_{21}+D_{20}=(n-1)D$, a n-th slice is automatically etched. A time interval can be preset between each slice to ensure that a single slice can be etched.

The third laser rangefinder configured to measure the distance from the etched area of the sample and the first laser rangefinder configured to measure the distance from the top surface of the ion beam shielding plate are sequentially arranged in the traveling direction of the ion beam. The first laser rangefinder is arranged in the area close to the broad ion beam source. The third laser rangefinder is arranged in the area of the first laser rangefinder away from the ion beam source. The second laser rangefinder configured to measure the non-etched area of the sample and the third laser rangefinder are arranged side by side, and are perpendicular to an ion beam traveling direction.

The laser rangefinder component provided by the present disclosure can achieve a measurement accuracy less than or equal to 10 nanometers, and at the same time, it is directly installed on the vacuum chamber wall without direct contact with the sample table and the ion beam, and does not produce position changes. As an absolute position origin, it can ensure high accuracy when the position of the ion beam shielding plate and the sample are detected.

Although the present disclosure has been described with reference to the preferred embodiments, various improvements can be made and components therein can be replaced with equivalents without departing from the scope of the present disclosure. In particular, as long as there is no structural conflict, the technical features in the embodiments can be combined in any way. The present disclosure is not limited to the specific embodiments disclosed herein, but should include all technical solutions falling within the scope of the claims.

In the description of the present disclosure, terms such as "central", "upper", "lower", "left", "right", "vertical", "horizontal", "inner", and "outer" indicate orientation or position relationships based on the drawings. They are merely intended to facilitate description, rather than to indicate or imply that the mentioned apparatus or components must have the specific orientation and must be constructed and operated in the specific orientation. Therefore, these terms should not be construed as a limitation to the present disclosure. Moreover, the terms "first", "second" and "third" are used only for the purpose of description, rather than to indicate or imply relative importance.

In addition, it should be noted that in the description of the present disclosure, unless otherwise clearly specified, meanings of terms "install", "connect with" and "connect to" should be understood in a broad sense. For example, the connection may be a fixed connection, a removable connection, or an integral connection, may be a mechanical connection or an electrical connection, may be a direct connection or an indirect connection via a medium, and may be an internal connection between two components. Those skilled in the art should understand the specific meanings of the above terms in the present disclosure based on specific situations.

In addition, terms "include", "comprise", or any other variations thereof are intended to cover non-exclusive inclusions, so that a process, an article, or a device/apparatus including a series of elements not only includes those elements, but also includes other elements that are not explicitly listed, or also includes inherent elements of the process, the article or the device/apparatus.

The technical solutions of the present disclosure are described in the preferred implementations with reference to the drawings. Those skilled in the art should easily understand that the protection scope of the present disclosure is apparently not limited to these specific implementations. Those skilled in the art can make equivalent changes or substitutions to the relevant technical features without departing from the principles of the present disclosure, and the technical solutions derived by making these changes or substitutions should fall within the protection scope of the present disclosure.

What is claimed is:

1. A three-dimensional (3D) imaging system for a nanostructure, comprising: a vacuum chamber, a sample loading device, an electron gun, an imaging signal detector, a broad ion beam source device, and a laser rangefinder component;

the vacuum chamber is configured to provide a high vacuum environment; the sample loading device is arranged inside the vacuum chamber; the sample loading device comprises a multi-axis movement table and a sample loading table, and the sample loading table is detachably arranged on the multi-axis movement table to load a sample to be tested; the multi-axis movement table is arranged inside the vacuum chamber to adjust a spatial pose of the sample loading table; the multi-axis movement table comprises a first bottom plate, a horizontal position adjusting mechanism, and a U-shaped table, and the U-shaped table comprises a connecting portion connected to the horizontal position adjusting mechanism at a bottom; the first bottom plate is arranged at an inner bottom of the vacuum chamber, and the horizontal position adjusting mechanism is arranged above the first bottom plate; the horizontal position adjusting mechanism is configured to adjust a horizontal transversal position and a horizontal longitudinal position of the U-shaped table; the U-shaped table comprises a U-shaped structure and a mandrel, both ends of the mandrel are separately rotatably connected to both side walls of the U-shaped structure, the mandrel is provided with a columnar structure on a side wall, the columnar structure and the mandrel are rotatably arranged, and a central axis of the columnar structure is arranged perpendicular to a central axis of the mandrel; and the columnar structure is provided with a groove at an end;

the sample loading table comprises a second bottom plate, a first direction adjusting device, a nano displacement mechanism, a sample holding mechanism, and an ion beam shielding mechanism, and a protrusion matched with the groove is formed at a bottom of the second bottom plate to fixedly connect the columnar structure; the first direction adjusting device is arranged at a top of the second bottom plate; the nano displacement mechanism is arranged above the first direction adjusting device, and the first direction adjusting device is configured to adjust a position of the nano displacement mechanism on a first plane; the sample holding mechanism is arranged on a side wall of the nano displacement mechanism, and the ion beam shielding mechanism is arranged on an outer side of the sample holding mechanism; the sample holding mechanism is configured to clamp the sample; and the ion beam shielding mechanism is configured to adjust a to-be-etched area of the sample; and the electron gun is arranged above the vacuum chamber, and the electron gun is configured to bombard a surface of the sample to excite a plurality of electronic signals; the imaging signal detector is configured to receive the excited electronic signals to obtain image information of the surface of the sample; the broad ion beam source device is configured to etch the sample; the sample loaded by the sample loading device is located in a traveling path of the broad ion beam source device, and a radial source of the broad ion beam source device is arranged in parallel with an etched surface of the sample; the laser rangefinder component comprises a first laser rangefinder and a second laser rangefinder, the first laser rangefinder is configured to measure a distance from a top surface of an ion beam shielding plate in the sample loading table, the second laser rangefinder is configured to measure a distance from a non-etched area of the sample, the first laser rangefinder and the second laser rangefinder are arranged side by side, and a laser traveling direction is perpendicular to a broad ion beam traveling direction of the broad ion beam source device.

2. The 3D imaging system for the nanostructure according to claim 1, wherein the sample holding mechanism comprises a first clamping plate and a second clamping plate arranged in parallel, the first clamping plate is arranged away from a side wall of the nano displacement mechanism, and the second clamping plate is arranged at a side away from the broad ion beam source device;

the first clamping plate is lower in height than the second clamping plate;

the first clamping plate is set as a wedge-shaped structure matched with the ion beam shielding mechanism at a top; and a side of the second clamping plate away from the first clamping plate is connected to the nano displacement mechanism through a coarse sample height adjusting structure; and the coarse sample height adjusting structure is configured to adjust a height of the sample.

3. The 3D imaging system for the nanostructure according to claim 2, wherein the ion beam shielding mechanism comprises the ion beam shielding plate and a shielding plate bracket, and the shielding plate bracket is connected to the ion beam shielding plate at one end, and connected to the second bottom plate at the other end; and a side of the ion beam shielding plate away from the shielding plate bracket is arranged in parallel with the wedge-shaped structure.

4. The 3D imaging system for the nanostructure according to claim 3, further comprising a pollution isolation cover, wherein the pollution isolation cover is sleeved on an outer side of an end of the electron gun; the pollution isolation cover is arranged in an inverted trapezoid, and the pollution isolation cover does not interfere with the broad ion beam source device and the laser rangefinder component; and a through hole and an auto-open/close shielding plate configured to shield the through hole are arranged at a bottom of the pollution isolation cover;

a plane of the sample loaded by the sample loading table is in a coverage area of the electron gun; the plane of the sample has an included angle θ with a radial action direction of the electron gun, wherein θ∈[90°, 150°]; and an axial center of the broad ion beam source device, an axial center of the first laser rangefinder, and an axial center of the electron gun are located in a same plane; and the laser rangefinder component and the broad ion beam source device are separated on both sides of the electron gun at a first preset included angle.

5. The 3D imaging system for the nanostructure according to claim 4, wherein the vacuum chamber is configured to provide a required environment based on a type of the sample, and the multi-axis movement table is configured to drive the sample loading table to move to a preset spatial position based on the broad ion beam source device and the spatial pose of the laser rangefinder component, the broad ion beam source device is configured to etches the sample, the first laser rangefinder and the second laser rangefinder are configured to obtain corresponding height information in real time, and then the imaging signal detector is configured to obtains image information of a slice of a preset thickness of the surface of the sample.

6. The 3D imaging system for the nanostructure according to claim 3, further comprising a pollution isolation cover, wherein the pollution isolation cover and the laser rangefinder component are both arranged on a first side wall of the vacuum chamber, and the laser rangefinder component is arranged inside a chamber formed by the pollution isolation cover and the first side wall;

the broad ion beam source device is arranged on a second side wall of the vacuum chamber, and a via for the broad ion beam source device to etch the sample is formed at one side of the pollution isolation cover; the second side wall is arranged adjacent to the first side wall; and a plane of the sample loaded by the sample loading table is in a coverage area of the electron gun; the plane of the sample is arranged perpendicular to a radial action direction of the electron gun; a radial action direction of the laser rangefinder component is arranged in parallel with the radial action direction of the electron gun; and a radial action direction of the broad ion beam source device is horizontally arranged.

7. The 3D imaging system for the nanostructure according to claim 6, wherein the sample loading table is configured to move to an inside of the pollution isolation cover, the broad ion beam source device is configured to etch the sample, and the first laser rangefinder and the second laser rangefinder are configured to obtain corresponding height information in real time; and the multi-axis movement table is configured to drive the sample loading table to move to a preset spatial position based on the spatial pose of the electron gun, and the imaging signal detector is configured to obtains image information of a slice of the surface of the sample.

8. The 3D imaging system for the nanostructure according to claim 1, wherein the imaging signal detector is a secondary electron probe, a backscatter probe, an electron backscatter diffraction probe, or a spectrum probe.

9. A 3D imaging method for shale nanopores, comprising following steps:

step S100, fixing a sample by a sample loading table to make a target area in the sample protrude;

step S200, controlling a multi-axis movement table to adjust the sample loading table to drive the sample to move to a preset spatial position matched with a position of a broad ion beam source device to meet preset etching requirements of the broad ion beam source device;

step S300, starting the broad ion beam source device for initial cutting, etching all areas by a preset thickness in a protruding target area, and then closing the broad ion beam source device;

obtaining a first two-dimensional (2D) slice through a imaging signal detector, covering an imaging calibration label during acquisition of an image, measuring a first distance from a top surface of an ion beam shielding plate in the sample loading table with a first laser rangefinder, and measuring a second distance from a non-etched area of the sample with a second laser rangefinder; and adjusting the multi-axis movement table and the sample loading table to a preset position based on the first distance, the second distance, and the preset spatial position;

step S400, performing etching for N times, determining whether a total etching thickness is the same as the preset thickness of the 2D slice, and if not, repeating step S300; and if yes, executing step S500; and step S500, obtaining a 3D model of the sample based on obtained N 2D slices.

10. The 3D imaging method for the shale nanopores according to claim 9, wherein in a working process, a required environment based on a type of the sample is provided by a vacuum chamber, and the multi-axis movement table drives the sample loading table to move to the preset spatial position based on the broad ion beam source device and a spatial pose of a laser rangefinder component, the broad ion beam source device etches the sample, the first laser rangefinder and the second laser rangefinder obtain corresponding height information in real time, and then the imaging signal detector obtains image information of a slice with the preset thickness of a surface of the sample.

11. The 3D imaging method for the shale nanopores according to claim 9, wherein in a process of etching the sample, the sample loading table moves to an inside of a pollution isolation cover, the broad ion beam source device etches the sample, and the first laser rangefinder and the second laser rangefinder obtain corresponding height information in real time; and after the etching is completed, the multi-axis movement table drives the sample loading table to move to the preset spatial position based on a spatial pose of an electron gun, and the imaging signal detector obtains image information of a slice of a surface of the sample.

* * * * *